United States Patent [19]

Gras

[11] 4,201,374
[45] May 6, 1980

[54] SUBSTRATE CARRIER

[75] Inventor: Ranulf W. Gras, Lincoln, Mass.

[73] Assignee: Teradyne, Inc., Boston, Mass.

[21] Appl. No.: 971,651

[22] Filed: Dec. 21, 1978

[51] Int. Cl.² .............................................. B25B 1/20
[52] U.S. Cl. ................................. 269/37; 269/254 R; 269/303; 269/321 WE
[58] Field of Search ................. 269/88, 37, 40, 41–44, 269/152, 228, 254 R, 303, 315, 319, 321 WE, 112; 211/41; 414/28; 220/21, 22.3, 22.4, 22.6

[56] References Cited

U.S. PATENT DOCUMENTS

| | | | |
|---|---|---|---|
| 2,538,165 | 1/1951 | Randtke | 220/22.6 |
| 3,151,761 | 10/1964 | Cloyd et al. | 220/21 |
| 4,104,099 | 8/1978 | Scherrer | 269/321 WE X |

Primary Examiner—Robert C. Watson

[57] ABSTRACT

A substrate carrier with a generally flat base, a plurality of fence portions protruding from the base to bear against sides of the substrates, and a plurality of arms spring biased toward the fence portions to retain the substrates, the arms having portions exposed to the underside of the base for engaging external actuating means to retract the arms for insertion or removal of the substrates.

16 Claims, 13 Drawing Figures

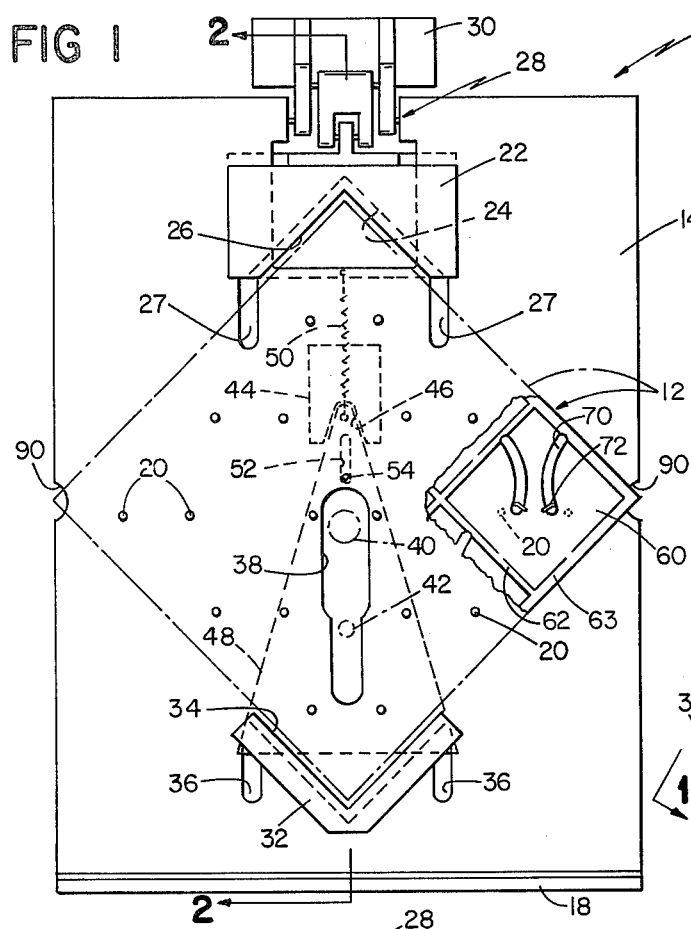
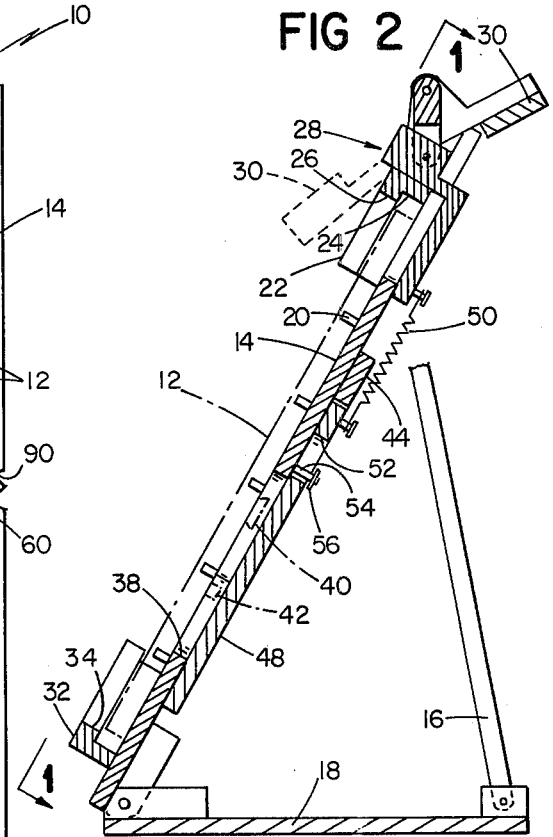
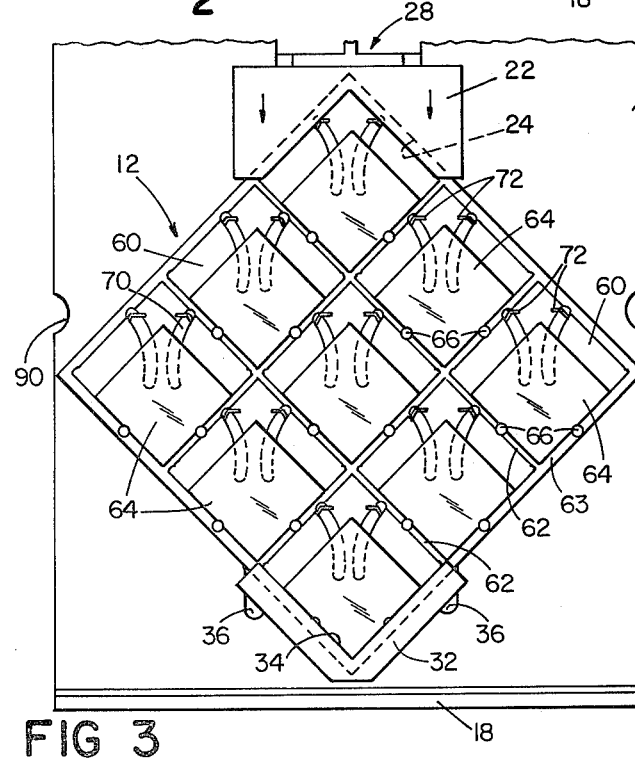
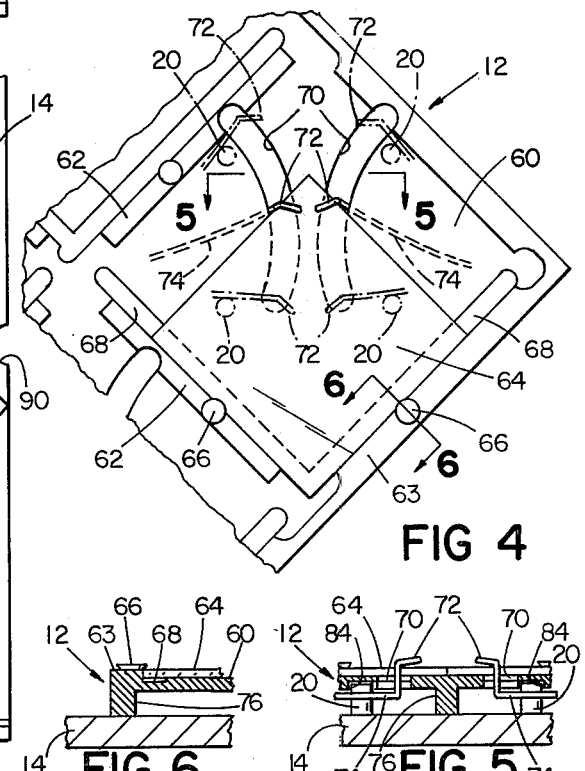
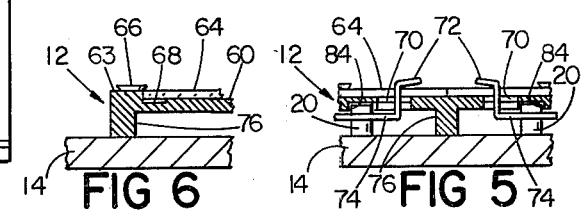

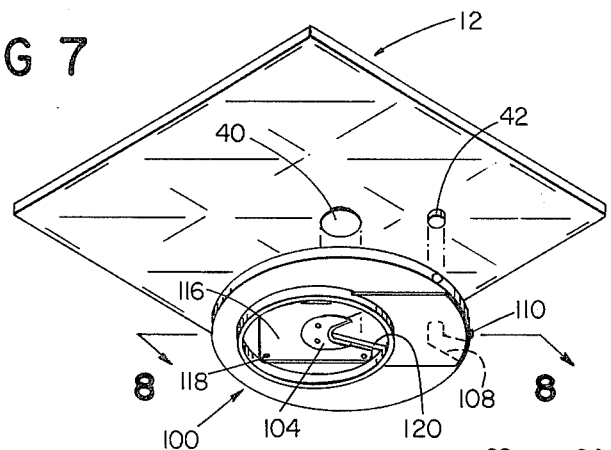
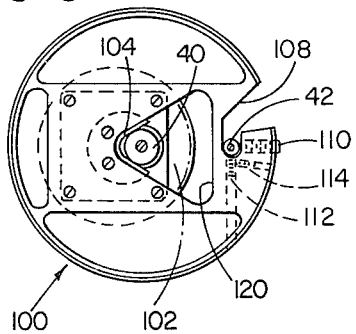
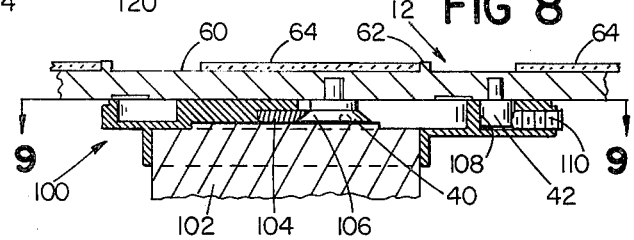
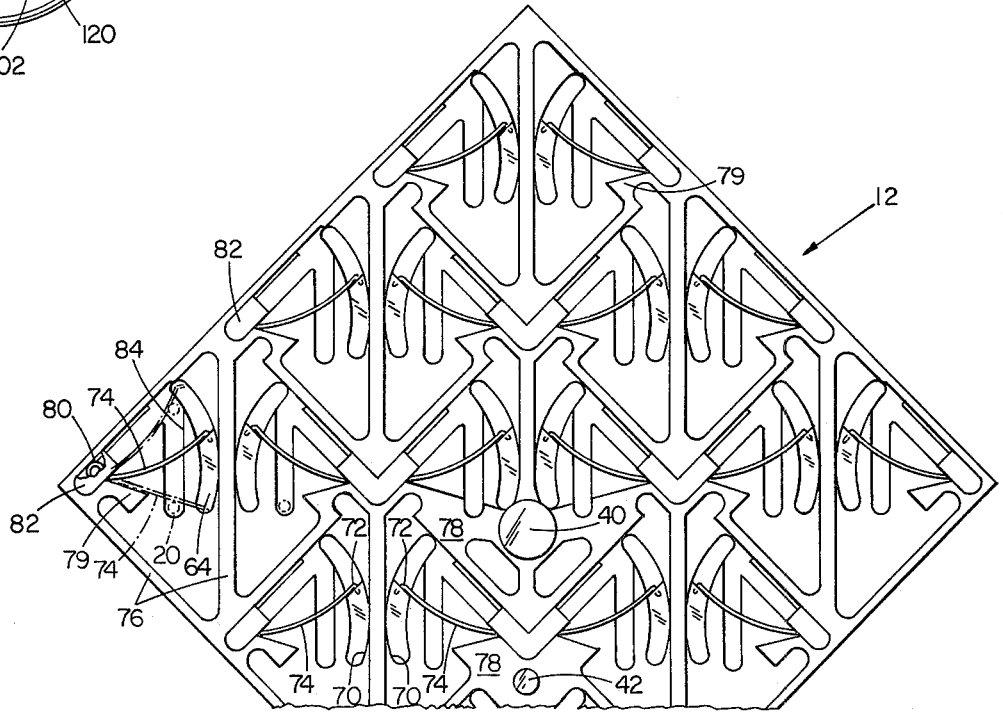

SUBSTRATE CARRIER

FIELD OF THE INVENTION

This invention relates to supporting substrates during manufacture of electrical components.

BACKGROUND OF THE INVENTION

In trimming and/or testing electrical components (e.g., resistors) that are mounted on substrates, it is often desirable to support the substrates on a carrier and mount the carrier on an XY table. Movement of the XY table shifts test contacts and laser trimming beams from one component to the next. To allow the XY table to make rapid movements between components, the carrier must be lightweight and yet provide adequate retention for the substrates to prevent them from moving and becoming misaligned with the test contacts. The substrates come in many different sizes, are relatively fragile, and are generally tested in large quantities.

SUMMARY OF THE INVENTION

I have discovered a carrier that can accommodate many different sized substrates with the necessary retention yet provides for gentle insertion to reduce substrate wear. Also discovered are an adaptor for rigidly mounting the carrier to an XY table and apparatus for cooperating with the carrier to allow rapid insertion and removal of substrates.

In one aspect, the invention features a substrate carrier with a generally flat base, a plurality of fence portions protruding from the base to bear against sides of the substrates, and a plurality of arms spring biased toward the fence portions to retain the substrates. The arms have portions exposed to the underside of the base for engaging external actuating means to retract the arms for insertion or removal of the substrates. In preferred embodiments, the arms are integral extensions of torsion springs and have hooked ends that protrude through arcuate slots in the base, and two arms and two fence portions aligned at right angles retain each substrate.

In another aspect, the invention features an adaptor with a frusto-conical wedge portion for mating with the frusto-conical surface of a first attachment pin on the carrier and a locking means cooperating with a second attachment pin on the carrier to press the wedge tightly against the first attachment pin.

In still another aspect, the invention features apparatus for actuating the substrate retaining arms, including a flat panel for supporting the underside of the base of the carrier, a plurality of pins extending upward from the panel for engaging the carrier arms, means to retain the carrier on the flat panel, and means to slide the carrier relative to the panel to cause the pins to move the carrier arms.

PREFERRED EMBODIMENT

We turn now to description of the structure and operation of a preferred embodiment of the invention, after first briefly describing the drawings.

Drawings

FIG. 1 is an elevation view at 1—1 of FIG. 2, showing the holder and one corner of the carrier without substrates (the remainder of the carrier being indicated by dashed lines).

FIG. 2 is a cross sectional view at 2—2 of FIG. 1.

FIG. 3 is a partial elevation view of the holder with the carrier in place and substrates inserted.

FIG. 4 is an enlarged elevation view of one corner of the carrier, showing the three positions of the substrate-retaining arms.

FIG. 5 is a cross sectional view at 5—5 of FIG. 4, showing the spring arms and retraction pins.

FIG. 6 is a cross sectional view at 6—6 of FIG. 4, showing a retention tack.

FIG. 7 is a perspective view looking up from underneath the carrier, showing the chuck adaptor in position for being mounted on the carrier.

FIG. 8 is a cross sectional view at 8—8 of FIG. 7, showing the chuck adaptor mounted to the carrier.

FIG. 9 is a plan view of the upper side of the chuck adaptor.

FIG. 10 is a plan view of the underside of the carrier, illustrating at one location the three positions of the spring arms.

FIGS. 11a, 11b, and 11c are diagrammatic views of a portion of the holder and one corner of the carrier, illustrating the sequence of steps taken to retract the spring arms of the carrier.

Structure

Referring to FIGS. 1 and 2, there is shown easel-like holder 10 for supporting substrate carrier 12. Holder 10 has sloping panel 14 held in position by legs 16 and base 18. Substrate carrier 12 is supported on the front side of panel 14 between upper and lower members 22, 32. Eighteen short pins 20, which extend from the front of the panel, engage portions of the carrier.

Upper member 22 has a V-shaped cutout 24 and lip 26 for engaging the upper corner of carrier 12, and slides vertically in slots 27 of panel 14, being actuated by over-center mechanism 28 and handle 30.

Lower member 32 also provides a V-shaped surface and a lip 34 for engaging the lower corner of the carrier. Lower member 32 slides in slots 36 in panel 14 and is fastened through the slots to triangular-shaped member 48 on the backside of panel 14. An elongated slot 38 is provided in the center of panel 14 to clear attachment pins 40, 42 (FIGS. 7 and 8) on the underside of carrier 12.

On the backside of panel 14, triangular-shaped member 48 is guided by means of slot 52 and pin 54 extending from the backside of the panel. Retention clip 56 on the end of pin 54 retains member 48. Stop plate 44 with V-shaped cutout 46 provides an upper stop for member 48, and spring 50 fastened between member 48 and over-center mechanism 28 provides an upward bias.

Referring to FIGS. 3 through 5, carrier 12 has a generally flat upper surface 60 divided by fences 62 into nine substrate receptacles. Lip 63 around the perimeter of the carrier also serves as a fence for some of the receptacles. Fences 62 and lip 63 protrude from surface 60 by about the average thickness of substrates 64. Further substrate retention is provided at each receptacle by retention tacks 66 (FIG. 6) fastened midway along fences 62 and at corresponding locations on lip 63. On the substrate sides of fences 62 and lip 63 there are L-shaped shallow grooves 68, to eliminate fillets between surface 60 and the fences and lip.

Biasing each of substrates 64 against fences 62 and lip 63 are two wire spring arms 74 with hooked ends 72. The hooked ends project upward through arcuate slots 70, there being two slots 70 at each of the nine receptacles.

Turning to FIG. 10, it can be seen that arms 74 are integral extensions of torsion springs 80 which are retained on the underside of the carrier under caps 82 (FIG. 10). Each of arms 74 extends along the underside of the carrier, in a direction generally transverse to slots 70, across one of shallow grooves 84. As illustrated in FIG. 5, when carrier 12 is mounted on holder 10, pins 20 are received in grooves 84.

For structural purposes, the underside of the carrier has a lattice of stiffening ribs 76 and has strengthened portions 78 surrounding attachment pins 40, 42. Stop portions 79 of ribs 76 provide stops for arms 74 when substrates are not installed. The overall thickness of the carrier is 0.25 inches, and it is machined from magnesium and then chemically hardened (Dow Treatment No. 17).

Referring to FIGS. 7 through 9, there is shown chuck adaptor 100 for mounting carrier 12 on the chuck 102 of an XY moving table. Adapator 100 has central wedge element 104 for engaging frusto-conical end 106 of attachment pin 40 on the carrier. Second attachment pin 42 is received in slot 108 of the adaptor, and locked in place by forcing it past the protruding end of screw 110. A second screw 112 stops movement of pin 42 after it is forced past screw 110, and third screw 114 locks screw 112 in place. Square recess 116 and holes 118 provide a means of attachment with chuck 102.

Operation

Electrical substrates 64 are mounted on carrier 12 using holder 10. The carrier is placed on the front surface of panel 14 as shown in FIG. 1, with two corners of the carrier aligned with half-circle cutouts 90. Installed in this position, arms 74 rest on top of pins 20 and thereby support the carrier. Pins 20 fit into the lower ends of grooves 84, as shown in broken lines for one arm in FIG. 10.

To retract arms 74 away from their stops to allow mounting of substrates 64, handle 30 is rotated forward to about the position shown in dashed lines in FIG. 2. This forces carrier 12 downward and allows triangular member 48 on the backside of panel 14 and lower V-shaped member 32 to drop until pin 54 reaches the end of slot 52. The fully down position is shown in FIG. 3. As the carrier is forced downward, pins 20, which remain stationary, force arms 74 to rotate upward, moving hooked ends 72 to the tops of slots 70, as shown in FIG. 3. This action is illustrated in FIGS. 11a, 11b, and 11c (and also by the positions shown in broken lines in FIGS. 4 and 10). FIG. 11a shows holder 14 and pins 20. FIG. 11b shows the carrier installed in the position shown in FIG. 1. FIG. 11a shows the carrier forced downward and spring arms 74 rotated and bent upward to the retracted position shown in FIG. 3. While the carrier is forced downward, lips 26, 34 on upper and lower gripping members 22, 32 prevent carrier 12 from springing outward free of pins 20.

The substrates can then be easily laid into place (FIG. 3) against fences 62 and lip 63. A slight jarring is all that is needed to align them.

To complete substrate installation, handle 30 is rotated back to its starting position to slowly raise carrier 12 and thereby bring spring arms 74 and hooked ends 72 gently down to rest against two sides of each substrate 64, as shown in FIG. 4. Lower member 32 moves upward with the carrier, being biased toward upper member 22 by spring 50.

With the substrates installed, the carrier may be mounted on an XY moving table using chuck adaptor 100. Pin 40 is inserted through triangular opening 120 in the adaptor with pin 42 aligned with slot 108. The adaptor is then moved sideways to move frusto-conical end 106 of pin 40 against wedge element 104 of the adaptor and to bring pin 42 further into slot 108. Finally, the carrier is rotated relative to the adaptor about the axis of central pin 40, thereby snapping in 42 past protruding screw 110 and forcing pin 40 tightly against wedge element 104. Removal of the carrier is achieved following the reverse procedure.

To remove the substrates, the carrier is first installed on holder 10 just as described above, with pins 20 below arms 74 and providing support. Handle 30 and over-center mechanism 28 are rotated to move the carrier downward and thereby retract arms 74 and hooked ends 72, and the substrates are removed by tilting them away from surface 60 of the carrier.

During laser trimming and testing, the carrier is moved between positions by the XY table by first lowering it, then moving it to a new XY location, and finally raising it. During the downward vertical movements, retention tacks 66 and hooked ends 72 of arms 74 hold the substrates in position.

The sideward retention force provided by arms 74 varies with the size of the substrates, as larger substrates cause greater deflection of a torsion springs 80. The retention forces are thus made roughly proportional to the inertial forces generated on the substrates during sideward motions of the XY table.

Generally, two carriers would be used for testing large quantities of substrates, one on holder 10 being loaded with new substrates, the other on the XY table.

Other embodiments of the invention will occur to those skilled in the art.

What is claimed is:

1. Apparatus for supporting substrates that carry electrical components, comprising:
   a base with a generally flat upper surface for supporting the undersides of said substrates,
   a plurality of fence portions protruding from said upper surface for bearing against sides of said substrates,
   a plurality of moveable arms for biasing said substrates against said fence portions,
   said arms including portions exposed to the underside of said base and adapted for engagement with external actuating means positioned below said base, and
   spring means for biasing said arms,
   whereby said arms can be retracted by said external means while said upper surface is fully accessible for insertion of said substrates.

2. The apparatus of claim 1 wherein said moveable arms have end portions protruding through slots in said base, said end portions being adapted to engage sides of said substrates to provide said biasing.

3. The apparatus of claim 2 wherein said moveable arms have lower portions extending generally transversely of said slot and beneath said base, said lower portions being adapted for engaging pins on said external means.

4. The apparatus of claim 3 wherein said base has grooves on the underside of said base for receiving said pins, said grooves extending generally transversely of said arms.

5. The apparatus of claim 3 wherein said slots are arcuate and said lower portions of said arms are integral extensions of torsion springs, whereby said arms rotate about the axis of a said torsion spring and said end portions move along a generally arcuate path in said slots.

6. The apparatus of claim 1 or 5 wherein said fence portions are arranged in pairs such that the two fence portions of each pair are at right angles to each other and wherein there are two said arms associated with each said fence pair, said arms providing a net said biasing force generally toward the center of said pair, whereby said apparatus can accomodate rectangular substrates of various sizes by placing each said substrate with two adjacent sides resting against said two fence portions of each said pair and engaging the two remaining sides with said two biasing arms.

7. The apparatus of claim 2 wherein end portions are hooked and said fence portions have lip portions for providing a lip over said substrates for providing retention of said substrates on said flat surface of said base.

8. The apparatus of claim 7 wherein said lip portions are tacks fastened to the top surfaces of said fence portions, said tacks having heads extending outward from said fence portions to provide said lip.

9. The apparatus of claim 1 or 7 further comprising grooves adjacent to said fences on the side on which said substrates are retained.

10. An adaptor for mounting the apparatus of claim 1 on a moving table, comprising:
a wedge portion including a frusto-conical surface for mating with a frusto-conical surface on a first attachment pin extending downwardly from the underside of the base of said apparatus and
locking means spaced from said wedge portion for cooperating with a second pin extending downwardly from the underside of said base to press together both said frusto-conical surfaces.

11. The adaptor of claim 10 wherein said wedge portion is V-shaped in a cross section taken along a plane perpendicular to the axis of said frusto-conical portion. and said frusto-conical portion is positioned at the center of said V-shape, whereby during mounting of said apparatus to said adaptor said first insertion pin is directed toward said frusto-conical surface of said wedge portion by said V-shape.

12. The adaptor of claim 11 wherein said locking means includes a groove extending transversely of the line connecting the centers of said locking means and said wedge portion, said groove being adapted to receive said second attachment pin, and wherein said groove includes a protuberance extending radially-inward from the wall of said groove furthest from said wedge portion, said protuberance being adapted to force said second attachment pin inward and through it force said first pin tightly against said wedge portion.

13. Apparatus for actuating the substrate retaining arms of the support apparatus of claim 1, comprising:
a flat panel for supporting the underside of the base of said support apparatus,
a plurality of pins extending upward from said panel for engaging exposed portions of said retaining arms,
means for retaining said support apparatus on said panel, and
means for sliding said support apparatus relative to said panel to cause said pins to move said arms, whereby said arms can be retracted to allow insertion or removal of said substrates.

14. The apparatus of claim 13 wherein said means for sliding includes a first member with a V-shaped surface for engaging one corner of said support apparatus.

15. The apparatus of claim 14 wherein said first member includes a lip for retaining said support apparatus.

16. The apparatus of claim 14 wherein said means for sliding further includes
an over-center mechanism and an operating handle, said mechanism being connected to said first member to slide it across said plate,
a second member spaced from said first member for retaining another side of said support apparatus, and
spring means for biasing said second member toward said first member.

* * * * *